United States Patent [19]

Curtis et al.

[11] 4,070,698
[45] Jan. 24, 1978

[54] POINT OF SALE AUTOMATIC ANNOUNCING SYSTEM WITH PREPROGRAMMED CAPACITY

[76] Inventors: Donald W. Curtis, Scotts Meadows Drive; Michael A. Branciforte, 803-A W. Church St., both of Laurinburg, N.C. 28352; Terry L. Tucker, 202 I Byrum St., Cary, N.C. 27511

[21] Appl. No.: 684,492

[22] Filed: May 10, 1976

[51] Int. Cl.² .................... G11B 5/00; G11B 31/00
[52] U.S. Cl. .......................... 360/12; 179/100.1 PS
[58] Field of Search .......................... 360/12, 74, 72; 179/100.1 C, 100.1 PS

[56] References Cited

U.S. PATENT DOCUMENTS

| | | | |
|---|---|---|---|
| 3,247,328 | 4/1966 | Mitchell | 179/100.1 PS |
| 3,330,915 | 7/1967 | Roberts | 179/100.1 PS |
| 3,601,553 | 8/1971 | Cooper, Jr. | 179/100.1 PS |
| 3,601,556 | 8/1971 | Cooper, Jr. | 179/100.1 PS |
| 3,647,991 | 3/1972 | Gaon | 360/12 |
| 3,708,632 | 1/1973 | Parilla | 360/12 |
| 3,767,864 | 10/1973 | Smith | 360/12 |
| 3,809,812 | 5/1974 | Smith, Sr. | 179/100.1 PS |
| 3,825,947 | 7/1974 | Rubin | 360/12 |
| 3,889,290 | 6/1975 | Seaton | 360/12 |

*Primary Examiner*—Jay P. Lucas

[57] ABSTRACT

A multi-track tape player having at least one program or commercial message recorded on each of a plurality of the tracks thereof is connected to a source of background music by a control system which, periodically, in response to a control signal from a timing mechanism, activates successive ones of the tracks of the tape player. As the commercial message or program commences, the background material is caused to fade out until the completion of the program, whereupon the background returns. A separate volume control for the tape player and background material allows the commercial message to be played at a higher volume than the background material. Further the control system includes various special selection circuits and overrides which adapt the control system to skip tracks, cancel a program being played, or start a program regardless of the timing sequence of the timing means.

12 Claims, 6 Drawing Figures

POINT OF SALE AUTOMATIC ANNOUNCING SYSTEM WITH PREPROGRAMMED CAPACITY

BACKGROUND OF THE INVENTION

In many commercial establishments, such as larger department stores, grocery stores, restaurants, shopping malls, outdoor amusement areas, and the like, there has been an increasing trend to provide patrons with background music or other background material. Such a source of background material provides the electrical and audio capacity to also periodically insert commercial messages or programs of varying sorts.

To date, most such special announcements have been made in person by the store manager, or some type of operator which manually switches off the background music, switches on his microphone, makes his announcement, switches off the microphone, and reactivates the background music. This is not totally desirable, in that the store manager or person making such an announcement is often busy, especially at peak hours, when such announcements would reach the largest audience and should be made. The result is that announcements often cannot be made on such a system according to a prescribed time schedule, as might be desirable.

Further, such advertisements are generally made by an announcer who has little or no training in announcing, voice projection, or otherwise is not so qualified to make such announcements, with the result that such announcements are often ineffective or even offensive. More effective commercial announcing can be achieved by a professionally recorded commercial; however, it is still necessary for the store manager to periodically activate the recorded program, and deactivate the music, with the same attendant disadvantages as set forth hereinabove as far as the timing is concerned.

The prior art has provided systems in which audible messages may periodically interrupt a background music or other material, e.g. U.S. Pat. Nos. 2,068,106; 3,147,346; and 3,825,947. However, no such system has combined with the general features, the additional capabilities of selectivity of the programs to be played, so that some selected commercial messages can be skipped when desired, overridden while they are being played, or started regardless of the timing sequence, nor is there in such systems the capability for playing the commercial announcement at a higher volume than the background music.

SUMMARY OF THE INVENTION

The present invention is directed to an improved commercial message system which periodically, at both prescribed intervals and at special command, interrupts the source of background music material with commercial announcements or programs. Toward this end, the message system includes a multi-track tape player outfitted with one or more tapes which include at least one programmed commercial announcement on a plurality of the tracks thereof and a control unit connecting said tape player and the circuit through which the background material is conducted to selectively and automatically intersperse prerecorded commercial messages.

Within the control system or unit, a timer periodically emits an electrical control signal or pulse at prescribed time intervals, thereby activating a starter circuit which in turn activates the tape motor. The commencement of a signal from the tape player is received by a music inhibitor circuit which fades out the background music. Unless otherwise programmed by an operator, the tracks will normally be played in order. However, a selecting means is provided and includes a plurality of secondary switches which may be activated by the operator for selecting one of the tracks to be played out of the normal order. Unless otherwise signalled, the control unit will normally play one track of the tape at each interruption, then automatically sequence to the next track for playing during the next interruption. However, secondary switches may be manually activated which cause skipping of selected tracks, cancelling of a program being played, or causing commencement of the next program regardless of the lack of a control signal from the timing means. A light indicator above a bank of skip switches, each corresponding to one of the tracks, indicates which track is playing or will be played at the next interruption.

The music or background material and the commercial message program are fed through separate amplifier circuits, so that the message may be played at a higher volume than the music, which is normally kept to a low volume. The timer includes an interval selector switch on the front panel of the control unit, which permits the timer to be set to allow one of a multiple number of timing intervals to pass between interruptions.

It is, therefore, an object of the present invention to provide an automatic announcing system of the type which automatically and periodically interrupts a source of background music with commercial program material.

Another object of the present invention is to provide a commercial message system of the type described which, although being automatic, may be manually varied by secondary switching circuits to skip selected tracks, cancel programs being played, or start a commercial program regardless of the timing.

Yet another object of the present invention is to provide a commercial message system of the type described in which the message system and source of background material have separate volume controls.

Other objects and a fuller understanding of the invention will become apparent from a study of the following disclosure in connection with the accompanying drawings, in which:

FIGS. 3 A-D are a schematic circuit diagram showing the electrical components of a preferred control system of the invention.

DETAILED DESCRIPTION OF A PREFERRED EMBODIMENT

General Operation

Figure 2:
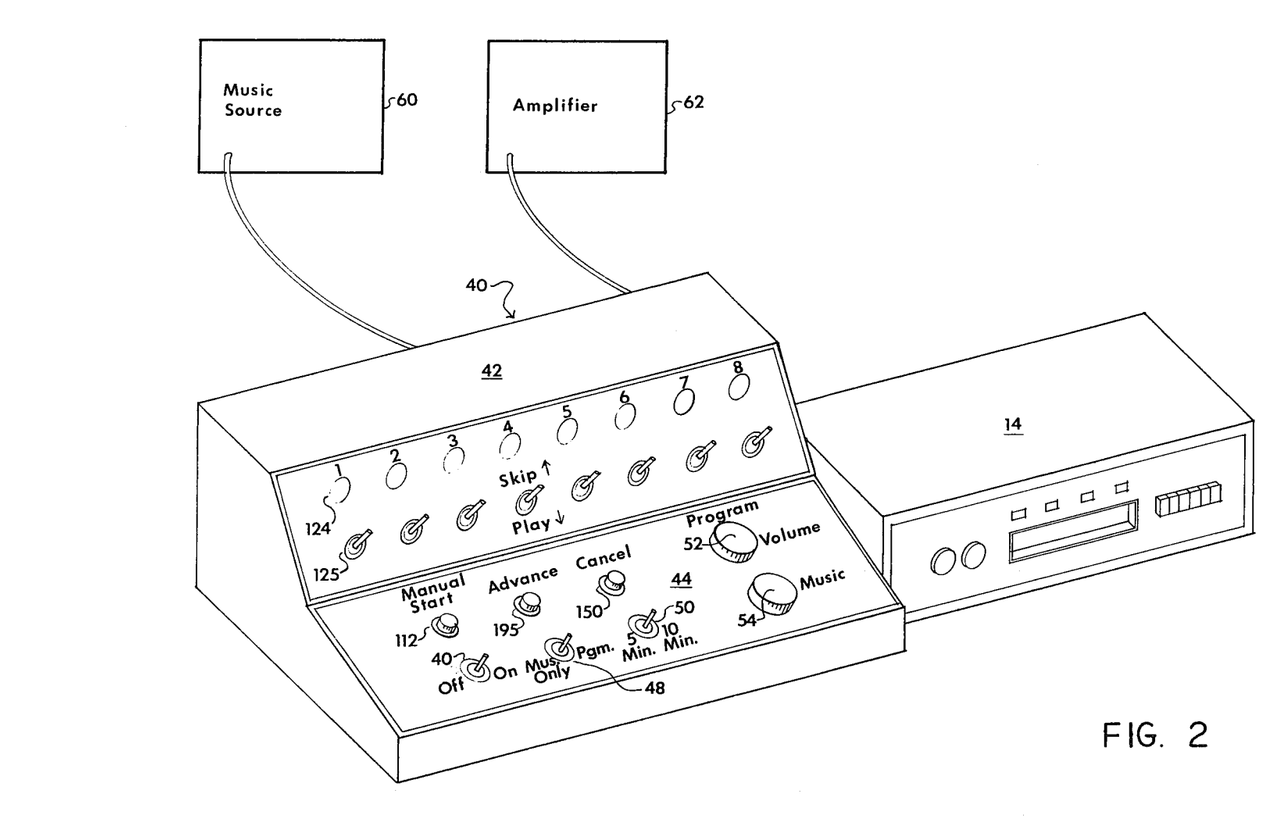
FIG. 2 is a perspective view of the control system housing according to the present invention.

Turning now to the drawings, and first of all to FIG. 2, there is illustrated in the form block diagram the automatic announcing system according to the present invention which periodically interrupts a conventional, already available source of background music or other similar program material with commercial announcements. The system includes a timing means 10 which emits a control signal at preselected time intervals determined by a time interval selector switch 100. The control signal is transmitted to initiate a program starter circuit 16, which in turn activates the motor of tape player 14 to commence the playing of a commercial program presented to the tape head by the automatic advancing circuit means 17 or a program previously selected and presented by one of the manual selector means 11, 13, 112 to be hereinafter described. Simultaneously with and responsive to the activation of tape player 14, a music inhibitor circuit 19 fades out the music or background material source 18. The source of music and the tape player have separately variable volume controls 22,24 respectively, so that the signal transmitted to the audio mixer 26 is amplified to a greater volume in the case of a commercial announcement coming from the tape player, than is the case with the background music coming from the source 18. From the audio mixer 26, either the background music or the commercial announcement is piped into a conventional P.A. system.

Figure 1:
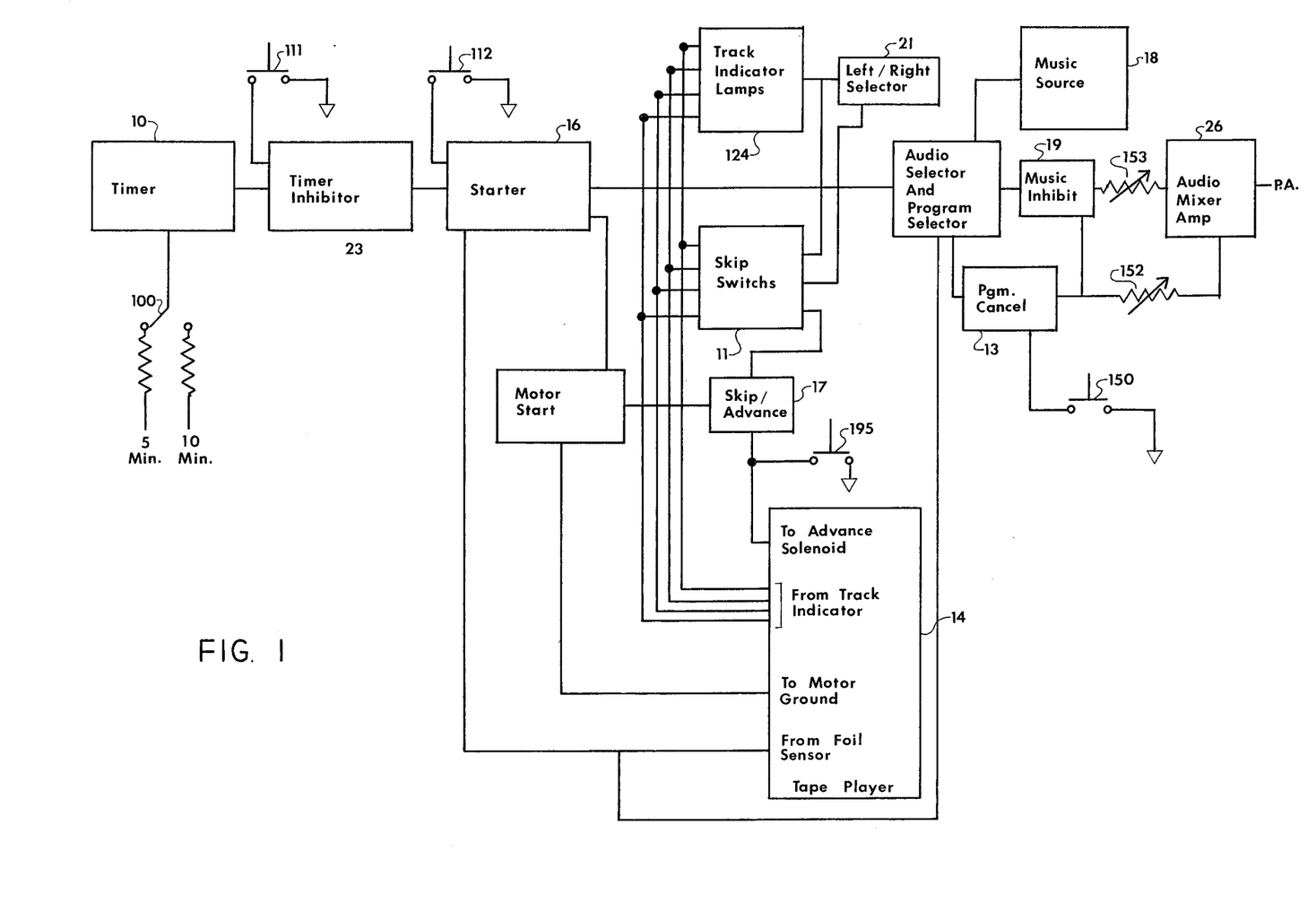
FIG. 1 is a block diagram indicating broadly the individual elements of the control system of the present invention.

Additionally, a selecting means is provided with the control system for manually controlling the track sequencing of the multi-track tape according to special variable requirements to add flexibility to the system. In this regard, the manual selector means includes skip circuit means 11 and a program cancel circuit 13 which permit selected tracks to be skipped or cancelled, and a manual start switch 112 which activates start circuit 16 regardless of the control signal from the timing means.

Within the control system a left-right selector circuit 21, determines which of two tracks, playing simultaneously in a stereo tape player, will be amplified and sent on to audio mixer 26.

MECHANICAL COMPONENTS

Turning now to FIG. 2, there is illustrated the aforementioned control unit 40 which includes a housing 42 in which the electrical circuitry and components are housed. On the front or top panel 44 of the housing 42, the various switches and controls are mounted, which include, first of all, a two position, on-off switch 184 for connecting a power source to the system. A mode selector switch 111 is a toggle-type switch, which when selectively activates a timer inhibitor circuit 23 so that if desired, all commercial advertising programs can be cut out entirely and music will be played continuously when switch 111 is placed in the MUSIC ONLY position. The time interval selector switch 100 may be a two-stage, toggle switch as illustrated in FIG. 2, or it may be a rotary type switch with multiple positions, if more than two prescribed time intervals are desired to be set.

Two volume control knobs 52,54 are attached to the shaft of variable resistors 152,153 respectively to selectively and separately control the volumes of the background music and the commercial advertisements. Push-button switches 112,195,150 manually activate the start circuit 16, the program advance circuit 17, and the program cancel circuit 13 respectively.

Along the top of the control panel 44 is a bank of on-off toggle switches 125 with corresponding indicator lamps 124, there being an indicator lamp for and corresponding to each toggle switch 125. Each of the toggle switches 125, hereinafter referred to as "skip" switches, is electrically connected to one of the tracks of the prerecorded program tape for selectively switching that track out of a preselected program if desired. The indicator lamps 124 indicate to the operator the track being played at that instant or to be next played if music is being played at that instant. By placing skip switches 125 in either the "SKIP" or "PLAY" position, a preselected omission of one or more tracks can be preset. For example, if the switches corresponding to indicator lamps 2, 3, 4 were placed in the "SKIP" position, and the indicator light over track 1 were on, this would indicate to the operator that track 1 was either playing or would be played next, to be followed by tracks 5, 6, 7 and 8 with tracks 2, 3 and 4 being omitted.

As illustrated in FIG. 2, in order to adapt a conventional system in which background music or material is piped over a P.A. system, it is only necessary to connect the output of the available background music source 60 to the input of the control unit 40. Then connect the output of control unit 40 to the input of the existing amplifier 62 which previously received the output of the background music source 60 directly.

ELECTRICAL ARRANGEMENT

Turning now to FIGS. 3 A-D, there is illustrated the circuit diagram for the control unit 40. First of all, the timer circuitry 10 includes an integrated circuit wired in the configuration of an astable multivibrator 105, which has the capability of oscillating at two different frequencies. The desired frequency is selected by time interval switch 100, which is a toggle switch selectively introducing either resistor 101 or resistor 102. When switch 100 is connected to carry current through resistor 102, the frequency emitted from the multivibrator 105 is 1 cycle/30 second, whereas when switch 100 is connected to carry the current through resistor 101, the frequency is 1 cycle/60 seconds.

Figure 3A:
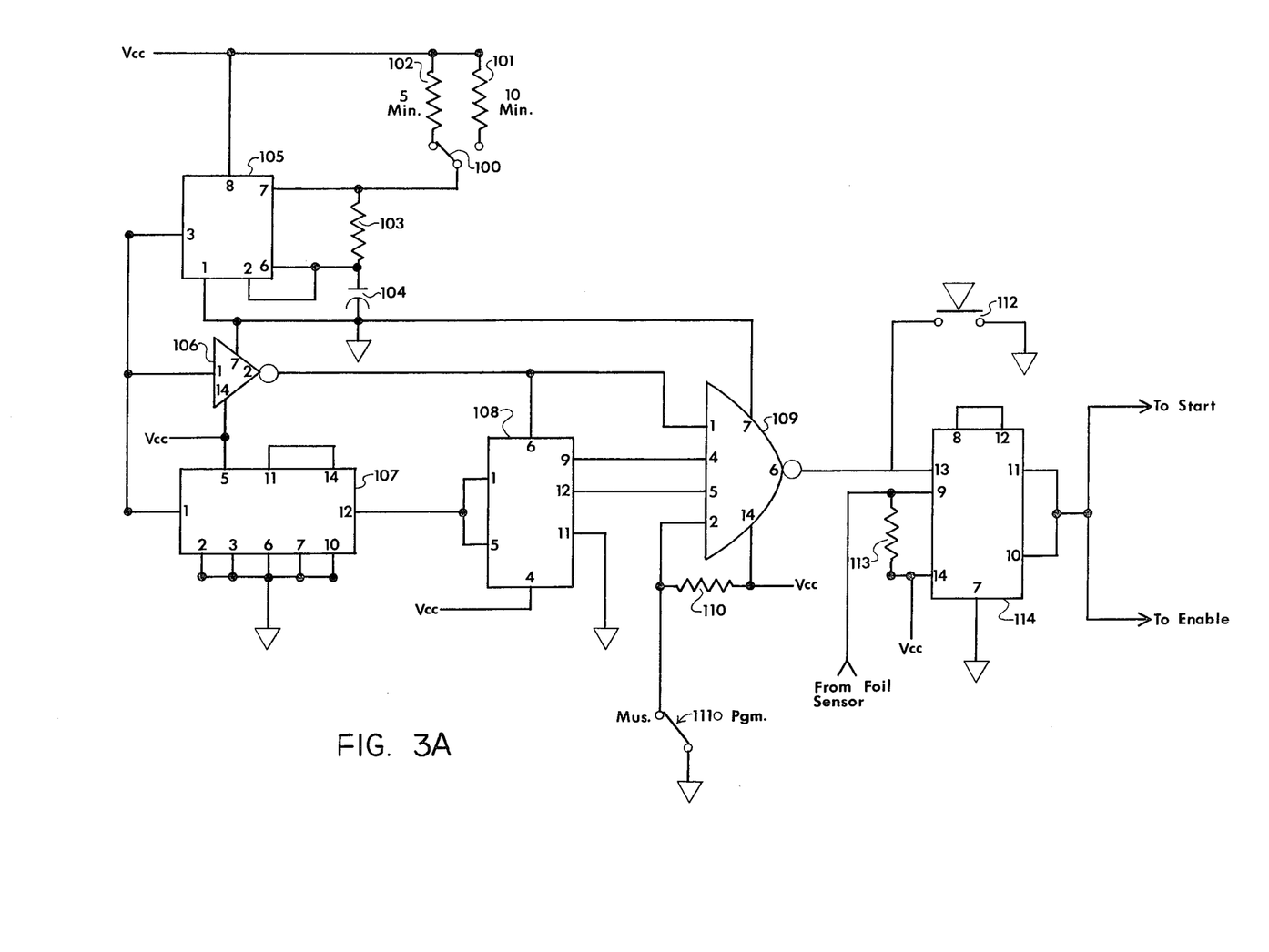

The output of the multivibrator 105 is applied simultaneously to a decade counter 107 and to a hex inverter 106. The output of hex inverter 106 is applied to both a J-K flip-flop 108 and a four-input NAND gate 109. The hex inverter 106 sets up the flip-flop 108 and the output of the decade counter 107 triggers flip-flop 108.

The output pulses from flip-flop 108 are gated through gate 109 with the output of the hex inverter 106 and the output of MODE SELECTOR switch 111. If the selector switch 111 is in the MUSIC ONLY position, then gate 109 is disabled. Conversely, if switch 111 is in the PROGRAM position, then gate 109 is enabled at the time that the outputs of hex inverter 106 and flip-flop 108 are high.

When all the inputs to the four-input NAND gate 109 are high, then the output of the gate goes low and emits a pulse, setting the RS flip-flop 114. It should be noted here that although the RS flip-flop 114 is preferably a type SN7472, it may also be a type SN7400 integrated circuit rewired as an RS flip-flop. Setting the RS flip-flop 114 causes its output to go high, which may also be accomplished by depressing the MANUAL START button 112. Resetting the RS flip-flop 114 is accomplished by applying the output of the conventional foil sensor (which is ground) from the magnetic tape itself to the reset input of flip-flop 114. Resetting the flip-flop will cause its output to return to low. The output of the RS flip-flop 114 is applied to both the PROGRAM ENABLE circuitry and the MOTOR START/AUTOMATIC ADVANCE circuitry.

Turning now to a description of the MOTOR START/AUTOMATIC ADVANCE circuitry, when the output of the RS flip-flop 114 is high, a pulse is transmitted to the base of transistor 177, which biases this transistor to an ON condition. Upon turning on of transistor 177, start relay 178 is pulled-in, supplying a ground to the motor of the tape deck, thereby commencing the playing of the program material. Relay 178 will stay in the pulled-in stage until the track has played and the output of RS flip-flop 114 returns to low. Also when start relay 178 is pulled-in, capacitor 179 charges to +12 volts. Subsequently, when relay 178 is de-energized, capacitor 179 discharges through transistor 183 causing it to conduct or be turned on. The activation of transistor 183, in turn, energizes a track skip relay 180, which supplies a ground to the conventional advance solenoid in the tape deck, thereby advancing the tape to the next track. Manual advance of the tape track may be accomplished by depressing the MANUAL ADVANCE button or switch 195, thereby alternatively supplying a ground to the advance solenoid.

Figure 3B:
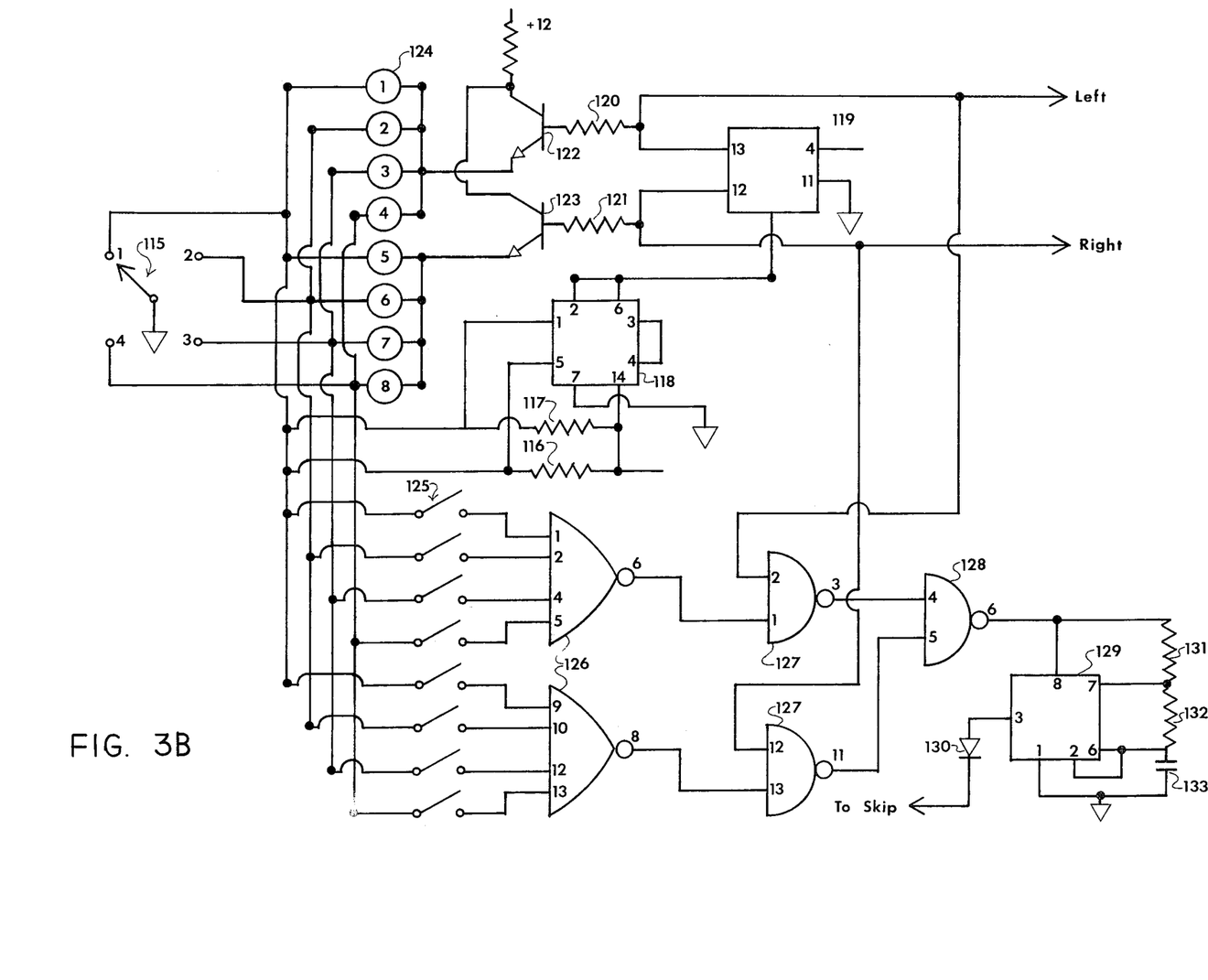

All conventional tape decks include as a component thereof a track indicator switch as indicated at 115. This indicator switch 115 supplies to the control unit 10 four-inputs necessary to activate the appropriate indicator lamp 124, establish a skip pulse, and determine which track is to be amplified (left or right). The LEFT/RIGHT SELECTOR is a J-K flip-flop 119 which is triggered by an RS flip-flop 118. The 37 set" input for the RS flip-flop is taken from the channel 1 output of the tape-deck channel indicator switch 115 as illustrated in FIG. 3B. The "reset" input is taken from the channel 2 output of the same switch. When the RS flip-flop 118 is set, its output pulse is low which triggers the J-K flip-flop 119. The output of J-K flip-flop 119 applied to the PROGRAM ENABLE, SKIP ENABLE, and the INDICATOR MATRIX.

When the base of transistor 122 is driven high by the output of the J-K flip-flop 119, then the appropriate indicator lamp 124 will be lit (1, 2, 3, or 4). Likewise, if the base of transistor 123 is driven high by the output of J-K flip-flop 119, then the appropriate one of indicator lamps 124 will be either 5, 6, 7 or 8, thereby indicating which track is either being played or is in position to be played next.

When the tape deck track indicator switch 115 is in the 1 position, the input to indicator lamps 1 and 5 will be low, and the input to the corresponding SKIP switches 125 (1 and 5) will likewise be low. This analysis follows for positions 2 (lamps and switches 2 and 6), position 3 (lamps and switches 3 and 7), and position 4 (lamps and switches 4 and 8). If transistor 122 is on, then one of the four indicators 1-4 will illuminate, depending on which position the tape deck track indicator switch 115 is in. Similarly, if transistor 123 is on, then one of indicators 5-8 will illuminate.

The SKIP circuitry includes a dual quad-input NAND gate 126, a quad dual-input NAND gate 127, and another timer 129 (integrated circuit wired as an astable multivibrator). When any one of the inputs to the respective quad-input NAND gate 126 is made low (by closing one of switches 125 and having the tape deck input for that particular switch low) then the output for that particular gate 126 will go high. This output is further gated with either the left or right output from the aforementioned circuitry which includes J-K flip-flop 119. This output drives the output of the next dual-input gate 128 high, which in turn supplies Vcc to the multivibrator 129, causing it to oscillate, which oscillation will continue as long as Vcc is applied to it. The output of multivibrator 129 is applied to the base of transistor 183 causing it to conduct, thereby energizing relay 180, which supplies a ground to the advance solenoid of the tape deck advancing the tape past the corresponding track. The outputs from the LEFT/RIGHT SELECTOR circuitry are also supplied to the PROGRAM ENABLE circuitry.

Turning now to a discussion of the AUDIO SELECTOR and PROGRAM ENABLE circuitry, when the output of the START/STOP circuitry illustrated in FIG. 3A is high, the output is seen at one of the inputs to two dual-input NAND gates 134,134a. The aforementioned input from the START/STOP circuitry is gated with either the LEFT or the RIGHT input from the LEFT/RIGHT SELECTOR through the NAND gates 134,134a. The low output of the enabled gate 134,134a is inverted by a corresponding hex inverter 135 or 136 and applied to the base of the respective 139,140, causing it to conduct and thereby enabling the proper optical relay 141,142. The aforementioned activation of the proper optical relay 141,142 allows the PROGRAM audio to be passed into both the SILENCE SENSING circuitry and the audio mixer/amplifier.

Figure 3C:
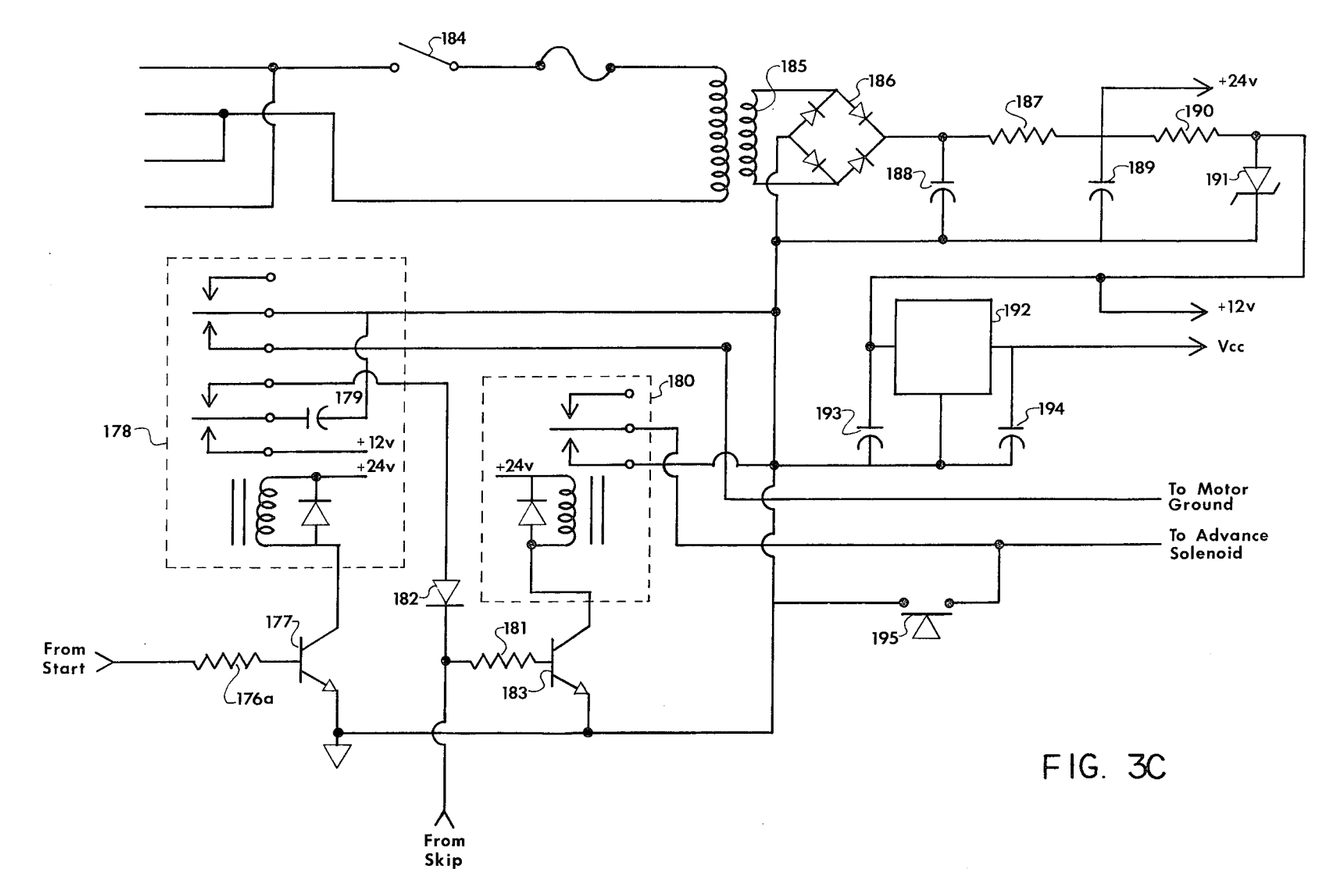

In order to cancel a program, when the output of the RS flip-flip 147 is high, transistor 145 conducts and supplies current for transistor 139 or 140 depending on which one is biased properly by the PROGRAM ENABLE circuitry. If the CANCEL push button switch 150 is depressed, the output from RS flip-flop 147 goes low, thereby cutting off transistor 145 and providing no current to either transistor 139 or 140. Thus both optical relays 141,142 are disabled with the result that the PROGRAM audio is cut off. Resetting of the RS flip-flop 147 is accomplished by applying the output of the foil senser to the reset input.

In order to inhibit the music or background material, when the PROGRAM audio is applied to the base of transistor 169, it is amplified and the positive peaks are shunted to ground, thereby leaving only the negative signal to be applied to the base of transistor 175 which acts to turn transistor 175 off. The shutting down of transistor 175 disables the optical relay 143 for the MUSIC, thereby removing the music or background audio from the audio mixer amplifier circuit.

Figure 3D:
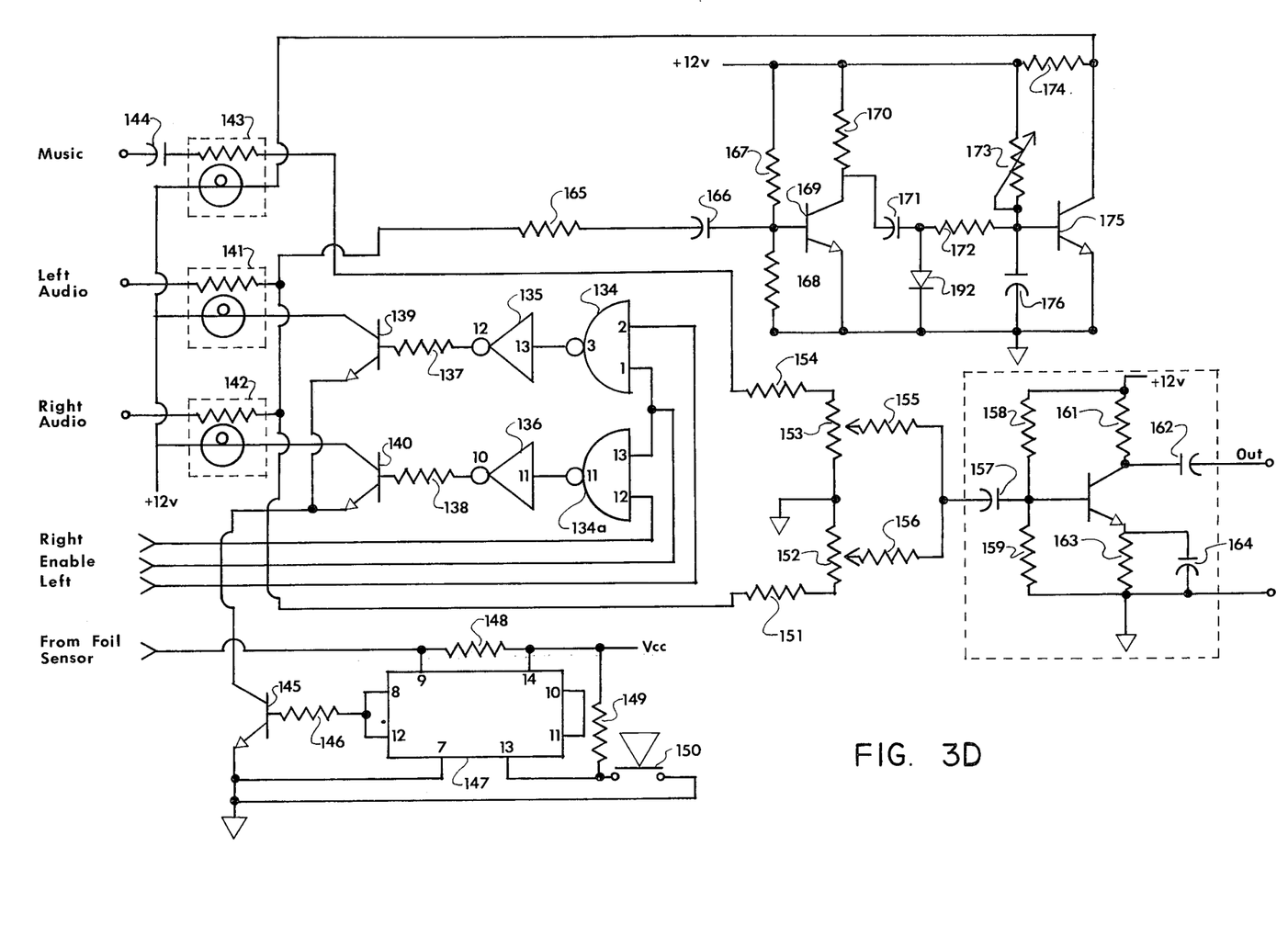

The power supply which is activated by ON-OFF switch 184 consists of a standard full wave bridge rectifier 186 followed by capacitive filtering and a Zener diode 191 for regulating the +12 voltage, and a voltage regulator 192 (LM309K) for regulating the logic supply voltage Vcc.

OVERALL OPERATION

For ease of explanation, the commercial announcements will be hereinafter referred to as the program or programs, and the background musics or other material will be referred to as background.

First of all, the ON-OFF switch 184 is activated to turn control unit 10 to the on position, and the MODE SELECTOR switch 111 is set either in the all background or the program position. Assuming the program position is selected, the control unit is then operational to consecutively, although intermittently play all eight programs which have been previously recorded on the 8-program memory bank (8-track tape). The sequence can be started at any of the eight programs by manually advancing through push button switch 195 the system to the desired program which will be indicated by one of lamps 124. To delete any program from the sequence, one or more of the PLAY/SKIP switches for the selected programs to be skipped are simply placed in the SKIP position. Thus any number of programs from 1 to 7 may be deleted, however, rather than deleting all eight programs, the mode selector switch 111 should merely be returned to the MUSIC position.

The desired time interval is selected by placing the time selector switch 100 in either of the two available positions, depending upon whether the operator wants announcements to occur every five minutes or every ten minutes, or such other intervals as may be provided with slight modification to the system. To manually start the program sequence, if desired, the MANUAL START push button switch 112 is depressed which immediately begins playing of the program as hereinabove described. If at any time a program has started and it is desired to delete it immediately, the CANCEL push button switch 150 will accomplish this.

At the end of each program the tape will be automatically advanced to the next program to be played by the discharge of capacitor 179 which activates relay 180. When a program is being played, the corresponding indicator lamp from the bank of lamps 124 is lit. While the background is playing and program is not, the indicator lamps 124 indicate the next program to be played.

Separate volume controls for both the program material and the background have been provided by variable resistors 152, 153. It is generally desirable to set the program volume at a higher level than the background volume.

Although it is believed the operation of the automatic announcing system is clear from the foregoing description, in order to amplify the disclosure, the values or types of the various components of the circuit are set forth hereinbelow in Table I.

TABLE I

| REFERENCE NUMERAL | IDENTIFICATION | VALUE OR TYPE |
|---|---|---|
| 100 | Toggle Switch | |
| 101 | Resistor | 120 K |
| 102 | Resistor | 56 K |
| 103 | Resistor | 2.2 K |
| 104 | Capacitor | 1000 uf |
| 105 | Multivibrator | NE 555 |
| 106 | Hex Inverter | SN 7404 |
| 107 | Decade Counter | SN 7490 |
| 108 | J-K Flip-Flop | SN 7473 |
| 109 | Four-Input NAND Gate | SN 7420 |
| 110 | Resistor | 1 K |
| 111 | Toggle Switch | |
| 112 | Push-Button Switch | NO |
| 113 | Resistor | 1 K |
| 114 | RS Flip-Flop | SN 7472 |
| 115 | 4-Position Indicator Switch (In Tapedeck) | |
| 116 | Resistor | 2.7 K |
| 117 | Resistor | 2.7 K |
| 118 | RS Flip-Flop | SN 7472 |
| 119 | J-K Flip-Flop | SN 7473 |
| 120 | Resistor | 1 K |
| 121 | Resistor | 1 K |
| 122 | Transistor | 2N2222 |
| 123 | Transistor | 2N2222 |
| 124 | Indicator Lamps (8) | |
| 125 | On-Off Switches (8) | |
| 126 | Four-Input NAND Gates (2) | SN 7420 |
| 127 | Dual-Input NAND Gates (2) | SN 7400 |
| 128 | Dual-Input NAND Gate | SN 7400 |
| 129 | Multivibrator | NE 555 |
| 130 | Diode | SK 3080 |
| 131 | Resistor | 2.7 K |
| 132 | Resistor | 15 K |
| 133 | Capacitor | 25 uf |
| 134 | Dual-Input NAND Gate | SN 7400 |
| 134a | Dual-Input NAND Gate | SN 7400 |
| 135 | Hex Inverter | SN 7404 |
| 136 | Hex Inverter | SN 7404 |
| 137 | Resistor | 1 K |
| 138 | Resistor | 1 K |
| 139 | Transistor | 2N2222 |
| 140 | Transistor | 2N2222 |
| 141 | Optical-Relay | 30ITI-12B1 |
| 142 | Optical-Relay | 30ITI-12B1 |
| 143 | Optical-Relay | 30ITI-12B1 |

TABLE I-continued

| REFERENCE NUMERAL | IDENTIFICATION | VALUE OR TYPE |
|---|---|---|
| 144 | Capacitor | 50 uf |
| 145 | Transistor | 2N2222 |
| 146 | Resistor | 1 K |
| 147 | RS Flip-Flop | SN 7472 |
| 148 | Resistor | 5 K |
| 149 | Resistor | 1 K |
| 150 | Push-Button Switch | NO |
| 151 | Resistor | 5 K |
| 152 | Variable Resistor | 5 K |
| 153 | Variable Resistor | 5 K |
| 154 | Resistor | 5 K |
| 155 | Resistor | 1 K |
| 156 | Resistor | 1 K |
| 157 | Capacitor | 10 uf |
| 158 | Resistor | 22 K |
| 159 | Resistor | 22 K |
| 160 | Transistor | 2N2222 |
| 161 | Resistor | 560 |
| 162 | Capacitor | 10 uf |
| 163 | Resistor | 470 |
| 164 | Capacitor | 25 uf |
| 165 | Resistor | 2.7 K |
| 166 | Capacitor | 10 uf |
| 167 | Resistor | 100 K |
| 168 | Resistor | 15 K |
| 169 | Transistor | 2N2222 |
| 170 | Resistor | 560 |
| 171 | Capacitor | .22 uf |
| 172 | Resistor | 4.7 K |
| 173 | Variable Resistor | 100 K |
| 174 | Resistor | 5 K |
| 175 | Transistor | 2N2222 |
| 176 | Capacitor | 150 uf |
| 176a | Resistor | 1 K |
| 177 | Transistor | 2N2222 |
| 178 | Relay (Four-pole, double throw) | 24v D.C. |
| 179 | Capacitor | 10 uf |
| 180 | Relay (Four-pole, double throw) | 24v D.C. |
| 181 | Resistor | 1 K |
| 182 | Diode | SK 3080 |
| 183 | Transistor | 2N2222 |
| 184 | Switch | NO |
| 185 | Step-Down Transformer | 24 volt A.C. |
| 186 | Bridge Rectifier, Full Wave | 600p.i.v., 2 amp. |
| 187 | Resistor | 30 |
| 188 | Capacitor | 1000 uf |
| 189 | Capacitor | 1000 uf |
| 190 | Resistor | 30 |
| 191 | Zener Diode | 12 volt |
| 192 | Diode | SK 3080 |

There is thus provided an improved automatic announcing system which permits selected, on-premises announcements over an existing public address system at regular, desired intervals. The control unit for the system allows the operator considerably more flexibility as far as which announcements will be played and the order in which they are played than in previously known systems.

Although a very detailed description has been set forth hereinabove of the preferred embodiment, it is evident that various changes could be made to the electrical components and circuitry without departing substantially from the scope of the invention, which is set forth in the following claims.

What is claimed is:

1. An automatic announcing system of the type which periodically interrupts a source of background material with a program of commercial announcements which comprising:
   a. a multi-track tape player, having a motor and a track advance solenoid;
   b. a control system comprising:
      i. a timing means for emitting a control signal at preselected time intervals;

ii. a program start circuit electrically connected between said timer and said tape player for periodically activating the motor of said tape player responsive to said control signal from said timing means;

iii. a track skip relay circuit operatively connected to said track advance solenoid for activation thereof responsive to (1st) completion of play of each track, or (2nd) a skip pulse;

iv. a preprogrammable selecting means connected to said tape player for selecting at a time previous to the playing of a tape which ones of said tracks will be played, said selecting means including a selectively activated skip circuit means electrically connected to said track skip relay so that when activated, said skip pulse is emitted; and v. a skip switch provided for each track of said tape and connected to said skip circuit means for initiating said skip pulse when the track corresponding to the skip switch selected would normally move into a play position.

2. The announcing system according to claim 1 whereby said selecting means further includes a program cancel circuit manually operated to cancel a program being played, a program advance circuit for selectively and manually activating said track advance solenoid, and a manual start circuit for selectively overriding the timing means and starting the succeeding program sequence at any time.

3. The announcing system according to claim 1 whereby said control system includes separate volume controls for said background material and said commercial announcement program.

4. The announcing system according to claim 1 whereby said control system includes a set of indicator lamps, each lamp corresponding to and electrically connected to said tape player and indicating which track is in the play position therein.

5. The announcing system according to claim 1 whereby said program start circuit includes a normally off transistor and a start relay connected to said motor, said normally off transistor receiving said control signal and activating said start relay to activate said motor.

6. The announcing system according to claim 1 wherein a left-right selector circuit is connected to said tape player for amplifying one of the left and right channels of each track, whereby programs can be recorded monaurally on each channel of each track and played separately.

7. An automatic announcing system of the type which periodically interrupts a source of background material being transmitted over a public address system with a program of prerecorded commercial announcements comprising:

a. a multi-track tape player having a motor and a track advance solenoid for automatically advancing to the next track upon completion of play of one track;

b. a control system interposed between said source of background material and said public address system and including:

i. a timing means and a program start circuit electrically connected together between said timing means and said tape player, said timing means emitting a control signal at preselected time intervals to intermittently activate succeeding tracks of the tape in said tape player;

ii. preprogrammable means operatively connected to said tape player for selectively prescribing in advance of starting the playing of the tape at least one track to be skipped as the automatic sequencing of said track advance solenoid proceeds during the course of playing the program.

8. The announcing system according to claim 7 wherein a left-right selector circuit is connected to said tape player for amplifying one of the left and right channels of each track, whereby programs can be recorded monaurally on each channel of each track and played separately.

9. The automatic announcing system according to claim 8 wherein said track skipping means comprises a skipping circuit electrically interposed between the left-right selector circuit and the track advance solenoid, a skip switch means interposed between said selector circuit and said skipping circuit and including an on-off switch corresponding to each track, whereby said skipping circuit may be selectively programmed in advance to activate said track advance solenoid when selected tracks are moved into a play position.

10. The automatic announcing system according to claim 7 and further including a program cancel circuit manually operated to cancel a program being played, a program advance circuit for selectively and manually activating said track advance solenoid, and a manual start circuit for selectively overriding the timing means and starting the succeeding program sequence at any time.

11. The announcing system according to claim 7 whereby said control system includes separate volume controls for said background material and said commercial announcement program.

12. The announcing system according to claim 7 whereby said program start circuit includes a normally off transistor and a start relay connected to said motor, said normally off transistor receiving said control signal and activating said start relay to activate said motor.

* * * * *